United States Patent
Lu et al.

(10) Patent No.: US 6,555,477 B1
(45) Date of Patent: Apr. 29, 2003

(54) METHOD FOR PREVENTING CU CMP CORROSION

(75) Inventors: Chen-Fa Lu, Kaohsiung (TW); Chin-Hsiung Ho, Sunnyvale, CA (US); Mei-Ling Chen, Kaoshiung (TW); Liang-Kun Huang, Yunlin (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 10/152,939

(22) Filed: May 22, 2002

(51) Int. Cl.$^7$ .............................................. H01L 21/302
(52) U.S. Cl. ...................... 438/692; 438/693; 438/694; 438/749; 438/751; 438/754; 134/1.3
(58) Field of Search ................................. 438/692, 693; 216/88, 89; 134/1.3; 138/694, 749, 751, 754

(56) References Cited

U.S. PATENT DOCUMENTS

| | | | |
|---|---|---|---|
| 6,409,781 B1 * | 6/2002 | Wojtczak et al. | 51/308 |
| 6,451,697 B1 * | 9/2002 | Sun et al. | 438/691 |
| 2001/0015345 A1 * | 8/2001 | Emami et al. | 216/89 |
| 2001/0052351 A1 * | 12/2001 | Brown et al. | 134/2 |

* cited by examiner

Primary Examiner—George Goudreau
(74) Attorney, Agent, or Firm—Tung & Associates

(57) ABSTRACT

A method for preventing or reducing corrosion of copper containing semiconductor features during chemical mechanical polishing (CMP) including providing a semiconductor wafer polishing surface including a copper layer overlying a copper filled anisotropically etched feature; polishing the semiconductor wafer polishing surface according to a first CMP process to remove at least a portion the copper layer to reveal a portion of an underlying barrier/adhesion layer; polishing the semiconductor wafer polishing surface according to a second CMP process including applying a neutralizing solution; polishing the semiconductor wafer polishing surface according to a third CMP process including applying a copper corrosion inhibitor solution; and, polishing the semiconductor wafer polishing surface according to at least a fourth CMP process to remove a remaining portion of the underlying barrier/adhesion layer.

20 Claims, 2 Drawing Sheets

METHOD FOR PREVENTING CU CMP CORROSION

FIELD OF THE INVENTION

This invention generally relates to chemical mechanical polishing (CMP) and more particularly to a method for preventing copper (Cu) corrosion due to localized chemical potentials during a chemical mechanical polishing (CMP) process.

BACKGROUND OF THE INVENTION

In semiconductor fabrication integrated circuits and semiconducting devices are formed by sequentially forming features in sequential layers of material in a bottom-up manufacturing method. The manufacturing process utilizes a wide variety of deposition techniques to form the various layered features including various etching techniques such as anisotropic plasma etching to form device feature openings followed by deposition techniques to fill the device features. In order to form reliable devices, close tolerances are required in forming features including photolithographic patterning methods which rely heavily on layer planarization techniques to maintain a proper depth of focus.

Planarization is increasingly important in semiconductor manufacturing techniques. As device sizes decrease, the importance of achieving high resolution features through photolithographic processes correspondingly increases thereby placing more severe constraints on the degree of planarity required of a semiconductor wafer processing surface. Excessive degrees of surface nonplanarity will undesirably affect the quality of several semiconductor manufacturing process including, for example, photolithographic patterning processes, where the positioning the image plane of the process surface within an increasingly limited depth of focus window is required to achieve high resolution semiconductor feature patterns.

In the formation of conductive interconnections, copper is increasingly used for forming metal interconnects such as vias and trench lines since copper has low resistivity and good electromigration resistance compared to other traditional interconnect metals such as aluminum. The undesirable contribution to electrical parasitic effects by metal interconnect residual resistivity has become increasingly important as device sizes have decreased.

Chemical mechanical polishing (CMP) is increasingly being used as a planarizing process for semiconductor device layers, especially for devices having multi-level design and smaller semiconductor fabrication processes, for example, having line widths below about 0.25 micron. CMP planarization is typically used several different times in the manufacture of a multi-level semiconductor device, including planarizing levels of a device containing both dielectric and metal portions to achieve global planarization for subsequent processing of overlying levels. For example, CMP is used to remove excess metal after filling conductive metal interconnect openings formed in dielectric insulating layers with metal to form features such as vias and trench lines. The vias and trench lines electrically interconnect the several levels and areas within a level that make up a multi-level semiconductor device.

In a typical process for forming conductive interconnections in a multi-level semiconductor device, a damascene process is used to form vias and trench lines for interconnecting different levels and areas within levels of the multi-level device. Vias (e.g., V1, V2 etc. lines) are generally used for vertically electrically interconnecting semiconductor device levels and trench lines (e.g., M1, M2, etc. lines) are used for electrically interconnecting semiconductor device areas within a level. Vias and trench lines are typically formed as part of a damascene process. Although there are several different methods for forming damascene structures, one typical method generally involves patterning and anisotropically etching a semiconductor feature, for example a via opening within an dielectric insulating layer to form closed communication with a conductive area included in an underlying level of the multi-level device. A similar process is then used to pattern and anisotropically etch a trench line opening overlying and encompassing the via opening to form a dual damascene opening structure. The dual damascene structure is then filled with a metal, for example copper, followed by a CMP step to remove excess copper overlying the dielectric insulating layer, also referred to as an inter-metal dielectric (IMD) layer surface, and to planarize the IMD layer surface for subsequent formation of an overlying device level. The process is then repeated in an overlying IMD layer to form a series of stacked conductive lines which electrically communicate between and within the various layers to form a multi-level semiconductor device. Typically, vias and dual damascene structures are stacked above one another to reduce an overall space requirement for patterning a semiconductor device.

CMP generally includes mechanical polishing assisted by chemical action to achieve selective material removal. CMP generally includes mounting wafer on a carrier with the wafer process surface face-down to contact a flat polishing surface, typically a polishing pad mounted on a rotating platen, imparting a downforce to the wafer backside and moving the wafer and the polishing surface relative to one another. The polishing action is typically aided by a slurry which includes for example, small abrasive particles such as silica ($SiO_2$), alumina ($Al_2O_3$), and ceria ($CeO_2$) that abrasively act to remove a portion of the process surface. Additionally, the slurry may include chemicals such as complexing agents and film forming agents that react with the process surface to assist in removing a portion of the surface material, the slurry typically being introduced to contact the polishing pad and thereby the wafer process surface.

Several semiconductor feature defects can be associated with CMP polishing. For example, in CMP polishing metals, for example copper features included in an array of metal interconnects, the copper is removed or eroded at a faster rate than the surrounding field of insulating dielectric. This causes a topography difference between insulating dielectric and the dense copper array. Such erosion can lead to excess removal of copper such that overlying formation of electrical interconnecting features, for example, stacked vias, leads to electrical failure by causing discontinuous electrical communication pathways.

Another CMP induce defect is related to the formation of copper interconnect features such as copper filled vias and trenches and the practice of forming a conformal barrier/adhesion layer within the anisotropically etched features prior to filling with copper. The barrier/adhesion layer is formed to prevent diffusion of copper into the dielectric insulating layer (IMD) within which the vias and trench openings are formed. The barrier/adhesion layer typically includes a refractory metal such as Tantalum (Ta) or refractory metal nitride such as tantalum nitride (TaN). After filling of the anisotropically etched features with copper, for example by electroplating, a CMP process is carried out to first remove the excess copper overlying the barrier/ adhesion layer and another CMP process performed to remove the barrier/adhesion layer overlying the IMD layer. During a portion of the CMP process, for example where both copper and barrier/adhesion material are exposed on the polishing surface, it is believed that a corrosive electrochemical reaction due to charge accumulation on the wafer surface and the presence of two dissimilar metals, for example tantalum and copper, results in corrosion of copper containing features. It is believed that the corrosive electrochemical reaction is due at least in part to locally induced Galvanic chemical potentials at the wafer surface, for example, at the copper/barrier layer interface where both the barrier layer and copper features are exposed to the polishing slurry.

For example, referring to FIG. 1 is shown a portion of a multi-level semiconductor device including dual damascene structures e.g., 10, 12 and 13, 15 forming stacked dual damascene structures. The stacked dual damascene structures include a via portion e.g., 10A,12A and a trench line portion e.g., 10B, 12B, formed in a first IMD layer 14A and a second IMD layer 14B. After patterning and anisotropically etching the via and trench openings in IMD 14A, a barrier/adhesion layer of for example, tantalum nitride, 16A, is conformally deposited to line the dual damascene structure prior to filling with copper, e.g., 18A, for example by an electrodeposition process. Following the copper filling process, a CMP process is carried out to polish back excess copper and the underlying barrier/adhesion layer formed over the IMD layer 14A surface (not shown) to planarize the IMD layer 14A prior to forming the overlying IMD layer 14B to form another overlying dual damascene structure, e.g., 12. During the CMP process, copper corrosion of the upper portion of, for example, trench line e.g., 10BA, 12B, may take place by electrochemical corrosion forming recessed areas in the upper portion of the trench lines e.g., 10B, 12B, devoid of copper filling e.g., as shown at e.g., 10C, 12C thereby inducing an open circuit in the electrical interconnect.

According To the prior art, several approaches have been proposed to reduce the copper corrosion action that takes place during CMP. One approach has been to add film forming agents or corrosion inhibitors to the slurry solution to inhibit the polishing of the copper surfaces. A problem with this approach is that the polishing rate of copper is frequently slowed to an excessive extent causing an undesirable increase in throughput times and slurry usage. In addition, the problem of localized electrochemical potentials on the wafer surface remains causing electrochemical corrosion of copper containing semiconductor features. Other approaches have included performing the CMP polishing process in a black box as it has been believed that localized electrochemical potentials were related to the production of electron-hole pairs from incident light. None of these approaches had been fully effective in eliminating copper corrosion of copper containing semiconductor features during CMP.

Therefore, there is a need in the semiconductor art to develop a CMP method for planarizing dielectric layers including copper semiconductor features such that CMP induced defects such as copper corrosion are reduced or prevented without undesirably slowing material removal rates.

It is therefore an object of the invention to provide a CMP method for planarizing dielectric layers including copper semiconductor features such that CMP induced defects such as copper corrosion are reduced or prevented without undesirably slowing material removal rates while overcoming other shortcomings and deficiencies in the prior art.

SUMMARY OF THE INVENTION

To achieve the foregoing and other objects, and in accordance with the purposes of the present invention, as embodied and broadly described herein, the present invention provides a method for preventing or reducing corrosion of copper containing semiconductor features during chemical mechanical polishing (CMP).

In a first embodiment, the method includes providing a semiconductor wafer polishing surface including a copper layer overlying a copper filled anisotropically etched feature; polishing the semiconductor wafer polishing surface according to a first CMP process including applying at least one polishing slurry to contact the semiconductor wafer polishing surface to remove at least a portion the copper layer to reveal a portion of an underlying barrier/adhesion layer; polishing the semiconductor wafer polishing surface according to a second CMP process including applying a neutralizing solution to contact the semiconductor wafer polishing surface to neutralize a semiconductor wafer polishing surface including chemical potentials; polishing the semiconductor wafer polishing surface according to a third CMP process including applying a copper corrosion inhibitor solution to contact the semiconductor wafer polishing surface to inhibit copper corrosion; and, polishing the semiconductor wafer polishing surface according to at least a to fourth CMP process to remove a remaining portion of the underlying barrier/adhesion layer.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the present invention is explained with respect to implementation in the context of stacked vias and dual damascene structures, it will be appreciated that the present invention is equally applicable to chemical mechanical polishing (CMP) of any copper containing feature included in a multi-level semiconductor device where application of the method of the present invention may be advantageously applied to prevent CMP induced defects by chemical corrosion of copper features including undesirable preferential polishing of copper containing features. It will be further appreciated that the method of the present invention is envisioned to be used several times in the manufacture of a multi-level semiconductor device and that the particular semiconductor manufacturing processes set forth herein are intended to exemplify the practice of the present invention.

It will be also understood that the use of the term 'copper' herein includes copper or alloys thereof.

Figure 1:
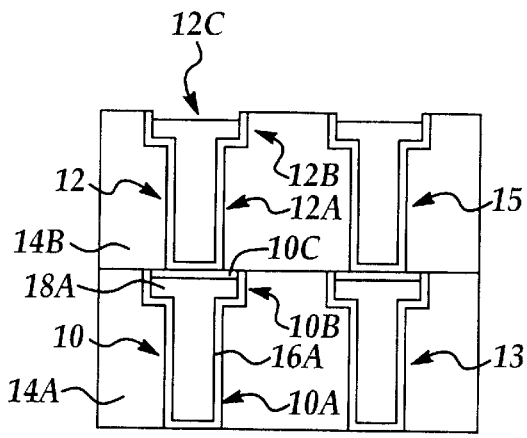
FIG. 1 is a cross sectional side view representation of a portion of exemplary copper containing semiconductor feature included in a multi-level semiconductor device showing the effect of copper corrosion following CMP processes according to the prior art.
Figure 2A:
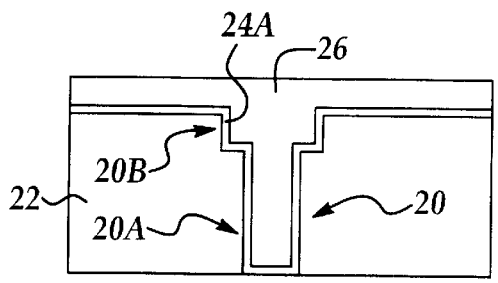
FIGS. 2A–2D are cross sectional side view representations of an exemplary copper containing semiconductor feature at different stages of manufacture including CMP processes according to embodiments of the present invention.

Referring to FIG. 2A, in an exemplary application of the present invention, is shown a cross sectional side view representation of a portion of a semiconductor device included in a semiconductor wafer having anisotropically etched dual damascene opening 20 including a via portion 20A and an overlying trench line portion 20B. While there are several ways to form a dual damascene structure, one approach involves at least two photolithographic patterning and anisotropic etching steps to first form via openings followed by a similar process to form overlying trench line openings encompassing one or more via openings. The dual damascene structures e.g., 20 are formed by sequentially anisotropically etching the via and trench line features in an IMD layer e.g., 22, for example, a low dielectric constant (e.g., less than 3.0) carbon and/or fluorine doped oxide formed by plasma enhanced CVD (PECVD).

Still referring to FIG. 2A, a barrier/adhesion layer 24A of a refractory metal or refractor metal nitride, for example, TaN nitride, is conformally deposited to include covering the sidewalls and bottom portion of the etched via feature 20A and sidewalls of the trench line feature 20B. The barrier/adhesion layer 24A serves the purpose of preventing copper diffusion into the surrounding IMD layer 22 and improving adhesion of subsequently deposited copper to fill the dual damascene structure.

Still referring to FIG. 2A, following deposition of barrier/adhesion layer 24A, a copper layer 26 is electroplated according to a conventional electrodeposition process to fill the via features and trench line features, e.g., 20A and 20B. Although other copper filling methods may be used, electroplating (electrodeposition) is preferred because of its superior gap-filling and step coverage. Prior to electrodeposition, a seed layer of copper (not shown) is conformally deposited over the barrier/adhesion layer 24A by, for example by PVD or CVD. The copper seed layer is preferably conformably deposited to form a continuous layer thereby providing a conductive surface for the subsequent electrodeposition process whereby an electrical potential is applied to the seed layer thereby creating a cathode in an electroplating system to electroplate copper ions out of an electrolyte solution onto the copper seed layer.

Figure 2B:
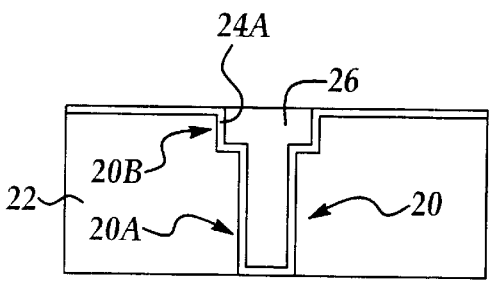

Referring to FIG. 2B, in an exemplary embodiment of the method according to the present invention, a first CMP process is first carried out to remove at least a portion of the excess copper layer 26 overlying the barrier/adhesion layer 24A. In one embodiment, the first CMP process is carried out to endpoint detection of the barrier/adhesion layer 24A underlying the copper layer 26. By the term 'endpoint detection' is meant that point at which a portion of the underlying barrier/adhesion layer is revealed by the polishing process. Endpoint detection may be accomplished by any process as long as the endpoint detection process detects a point in the CMP process at which a portion of the semiconductor polishing surface includes exposure of a portion of the barrier/adhesion layer 24A underlying copper layer 26 and a portion includes a remaining portion of the overlying copper layer 26. For example, preferably, at endpoint detection there will be portions of the semiconductor process surface where the barrier/adhesion layer is exposed and portions where the copper overlayer remains. Exemplary endpoint detection systems include, for example, real-time optical detection methods including wafer polishing surface reflectance measurements, as well as laser interferometry. In addition, methods such as polishing pad motor load monitoring, or monitoring the electrical potential of the polishing effluent may be suitably used for endpoint detection.

The first CMP process according to the present invention is preferably carried out using a conventional copper CMP process using any conventional slurry for polishing a copper containing semiconductor wafer surface. For example, a linear or rotary polisher may be used as is known in the art. For example, copper polishing slurries including abrasive particles including silica ($SiO_2$), alumina ($Al_2O_3$), ceria ($CeO_2$), titania ($TiO_2$), zirconia ($ZrO_2$), magnesia (MgO), and manganese oxide ($MnO_2$), or combinations thereof are suitable for use as abrasive agents included in polishing slurries. For example, abrasive particles included in conventional slurries suitably comprise about 5 weight percent to about 30 weight percent of the polishing fluid.

In an exemplary embodiment of the present invention, the first CMP process is carried out with a conventional copper CMP slurry including abrasive particles. In addition, the copper polishing slurry may suitably include an oxidizing agent such as hydrogen peroxide ($H_2O_2$) to form a copper oxide passivation layer in-situ to better control material removal rates. Other oxidizing agents may be suitably used including compounds having a peroxy group such as peroxides and percarbonates. For example, the oxidizing agent is typically present in an amount ranging from about 0.3 to about 17.0 weight percent. The pH of the first CMP process polishing slurry for example, is typically within a range of from about 3 to about 6, more preferably within a range of from about 4 to about 5. Further, the copper removal rate is typically from 300 to 1,000 Angstroms/min.

In one embodiment of the present invention, following endpoint detection during the first CMP process, the application of the copper polishing slurry to the semiconductor wafer polishing surface is stopped and a neutralizing solution is applied to contact the wafer polishing surface for a period of time in a second CMP process to neutralize or remove ionic chemical species creating chemical potentials including electrochemical potentials at the wafer surface. For example, the neutralizing solution preferably includes a carboxylic acid solution, having at least one carboxylate group in an amount ranging from about 0.1 to about 10.0 weight percent of the neutralizing solution with the remaining portion deionized water. Exemplary carboxylic acids include formic acid, acetic acid, propionic acid, valeric acid, oxalic acid, malonic acid, succinic acid, glutaric acid, maleic acid, fumaric acid, phthalic acid, glycolic acid, lactic acid, citric acid, tartaric acid, gluconic acid, adipic acid, and combinations thereof. Preferably, the neutralizing solution has a pH of between about 4.0 and about 6.0. In another embodiment, the cleaning solution comprises a commercially available solution of Electra-Clean™, from Applied Materials Inc. It is believed that the neutralizing solution acts to neutralize localized chemical potentials thereby preventing chemically induced copper corrosion.

Preferably the neutralizing solution is added to contact the wafer polishing surface while the wafer and polishing pad are relatively rotated during the application of the neutralizing solution. Although it will be appreciated that the CMP polishing time for the second CMP polishing process will vary depending on the application rate of the neutralizing solution and the rotation rate of the polishing pad, in an exemplary embodiment, the neutralizing solution is applied for a period of about 10 seconds to about 30 seconds. The neutralizing solution is preferably applied to contact the wafer polishing surface by conventional methods including, for example, flowing or spraying the neutralizing solution onto the polishing pad during CMP polishing action where it subsequently contacts the wafer polishing surface. Alternatively, the neutralizing solution may be applied to contact the wafer polishing surface by applying the neutralizing solution through the polishing pad to contact the polishing pad surface during CMP polishing action as is known in the art.

Following the second CMP polishing process including the neutralizing solution, a third CMP polishing process is carried out where a copper corrosion inhibitor solution is applied to contact the polishing pad and the wafer polishing surface during CMP polishing action in the same manner as outlined for the neutralizing solution. It will be appreciated that application of the neutralizing solution during the second CMP polishing process is stopped prior to application of the copper corrosion inhibitor solution during the third CMP polishing process. It will further be appreciated that the CMP polishing action (relative rotation of the polishing pad and wafer) may continue during the stopping of the application of one solution, for example, the neutralizing solution, and another solution, for example, the copper corrosion inhibitor solution. Preferably, the copper corrosion inhibitor solution includes at least one of Benzotriazole (BTA), and Benzotriazole derivatives such as Triazole, and Tritriazole. BTA is preferred as it has been found to be the most effective copper corrosion inhibitor. The copper corrosion inhibitor solution preferably includes a mixture of BTA and deionized water including a concentration of BTA from about 0.02 weight percent to about 0.1 weight percent. Although it will be appreciated that the CMP polishing time for the third CMP polishing process will vary depending on the application rate of the copper corrosion inhibitor solution and the rotation rate of the polishing pad, in an exemplary embodiment, the neutralizing solution is applied for a period of about 10 seconds to about 30 seconds, more preferably about 20 seconds.

Figure 2C:
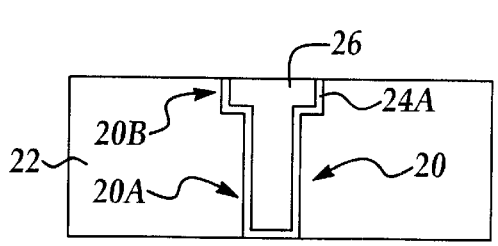

Referring to FIG. 2C, following the third CMP polishing process, a fourth CMP polishing process using a conventional barrier/adhesion layer polishing slurry is used to polish, for example, a tantalum nitride barrier/adhesion layer. The fourth CMP polishing process is carried out to remove the remaining barrier/adhesion layer overlying the IMD layer. It will be appreciated that the period of time for removal of the barrier/adhesion layer will vary depending on the material removal rate and barrier/adhesion layer thickness, a typical removal rate being about 400 Angstroms/min and a typical polishing time for the fourth CMP polishing process being about 60 to about 90 seconds.

Figure 2D:
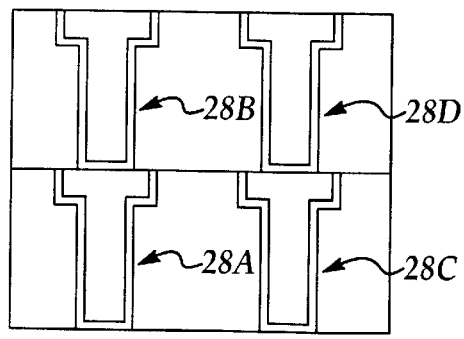

Following the fourth CMP process an optional fifth CMP process including an oxide buffing process to buff the exposed IMD layer and complete a CMP planarization process is carried out including the application the copper corrosion inhibitor solution during the polishing process to contact the wafer polishing surface. For example, the fifth CMP process is carried out for a period of between about 10 seconds and 30 seconds to complete the CMP process. Referring to FIG. 2D is shown a side view representation of an idealized series of stacked dual damascene structures, e.g., 28A, 28B, 28C and 28D following manufacture including the first through fourth CMP processes according to the present invention. The copper recesses due to electrochemical corrosion according to CMP processes of the prior art are prevented in the method of the present invention, providing fully filled copper interconnects for continuous electrical communication.

Figure 3:
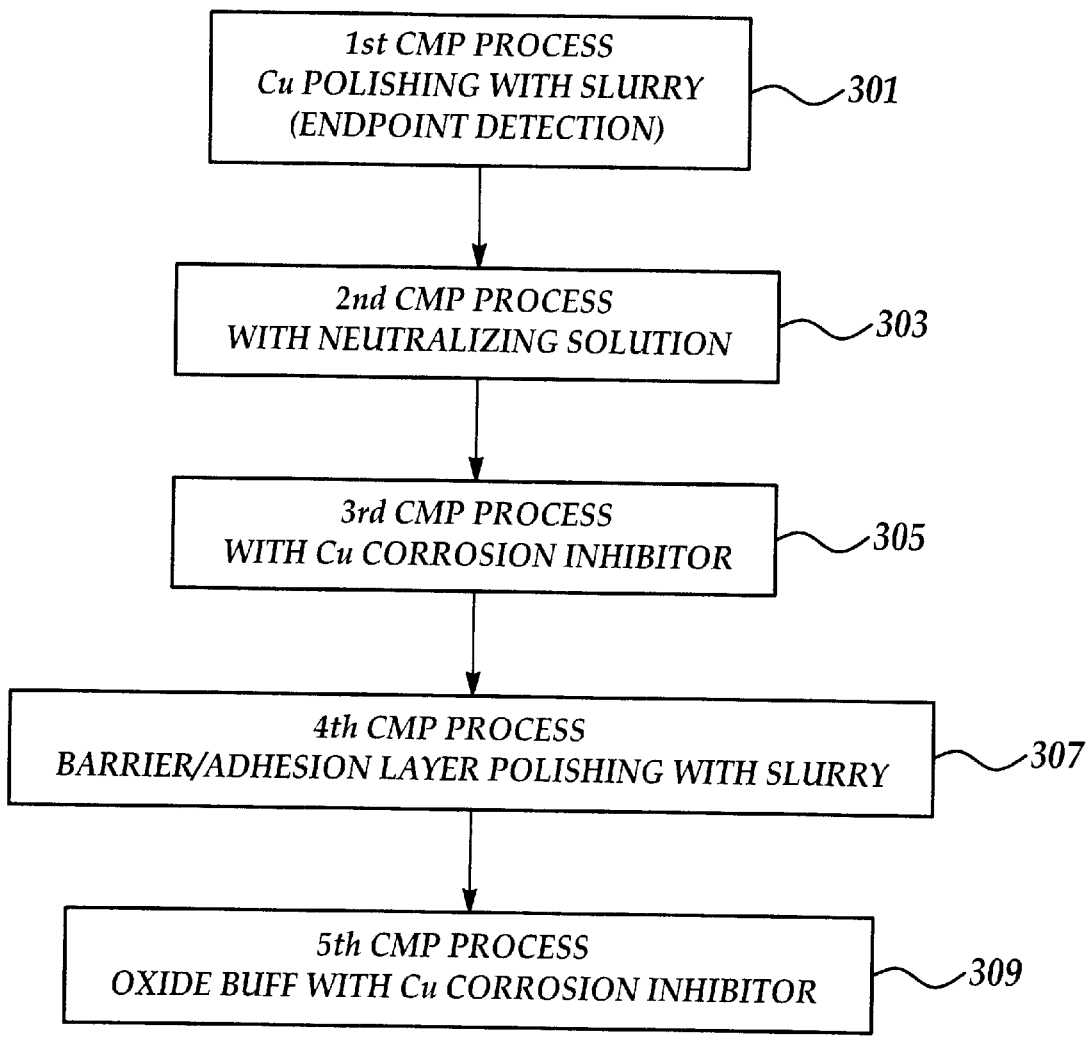
FIG. 3 is a process flow diagram including several embodiments of a CMP process according to the present invention.

Referring to FIG. 3, several of the embodiments of the present invention are shown. A first CMP process 301 using a conventional copper polishing slurry is carried out to endpoint detection to remove an uppermost layer of copper to reveal a portion of an underlying barrier/adhesion layer, for example, tantalum nitride. In a second CMP process 303 a neutralizing solution is applied to contact the wafer polishing surface for a period of time. In a third CMP process 305, a copper corrosion inhibitor is applied to contact the wafer polishing surface for a period time. Preferably the copper corrosion inhibitor is a BTA/deionized water solution. In a fourth CMP process 307, a conventional barrier/adhesion layer polishing slurry is used to remove a remaining portion of, for example, a tantalum nitride barrier adhesion layer. In optional process 309, a fifth CMP process including an oxide buffing process including the application of the copper corrosion inhibitor solution to contact the wafer polishing surface is carried out for a period of time to complete the planarization of the semiconductor polishing surface, for example, an IMD layer.

It will be appreciated that the CMP process may use various combinations of polishing pads and platens. In addition it will be appreciated that rinsing steps using a rinsing polishing pad with a rinsing solution, for example deionized water may be applied before or following any of the first through the fourth CMP processes. It will further be appreciated that the first, second, third, and fourth CMP processes may be carried out different polishing platens with the polishing slurry, neutralizing solution, and copper corrosion inhibitor applied through the same or different applicator nozzles.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for preventing or reducing corrosion of copper containing semiconductor features during chemical mechanical polishing (CMP) comprising the steps of:

providing a semiconductor wafer polishing surface including a copper layer overlying a copper filled anisotropically etched feature;

polishing the semiconductor wafer polishing surface according to a first CMP process including applying at least one polishing slurry to contact the semiconductor wafer polishing surface to remove at least a portion the copper layer to reveal a portion of an underlying barrier/adhesion layer;

polishing the semiconductor wafer polishing surface according to a second CMP process including applying a neutralizing solution to contact the semiconductor wafer polishing surface to neutralize a semiconductor wafer polishing surface including chemical potentials;

polishing the semiconductor wafer polishing surface according to a third CMP process including applying a copper corrosion inhibitor solution to contact the semiconductor wafer polishing surface to inhibit copper corrosion; and, polishing the semiconductor wafer polishing surface according to at least a fourth CMP process to remove a remaining portion of the underlying barrier/adhesion layer.

2. The method of claim 1, wherein the first CMP process includes polishing the copper layer to endpoint detection.

3. The method of claim 1, wherein the neutralizing solution includes at least one carboxylic acid selected from the group including formic acid, acetic acid, propionic acid, valeric acid, oxalic acid, malonic acid, succinic acid, glutaric acid, maleic acid, fumaric acid, phthalic acid, glycolic acid, lactic acid, citric acid, tartaric acid, gluconic acid, and adipic acid.

4. The method of claim 3, wherein the neutralizing solution has a pH of between about 4.0 and about 6.0.

5. The method of claim 1, wherein the neutralizing solution includes Electraclean™.

6. The method of claim 1, wherein the copper corrosion inhibitor solution includes at least one of Benzotriazole (BTA) and derivatives thereof.

7. The method of claim 6, wherein the copper corrosion inhibitor solution includes a mixture of Benzotriazole (BTA) and deionized water.

8. The method of claim 6, wherein the Benzotriazole BTA is present in an amount from about 0.02 to about 0.1 weight percent.

9. The method of claim 1, further comprising the step of polishing the semiconductor wafer polishing surface according to a fifth CMP process including applying a BTA containing solution to contact the semiconductor wafer polishing surface.

10. The method of claim 9, wherein the BTA containing solution includes BTA present in an amount from about 0.02 to about 0.1 weight percent.

11. A method for preventing or reducing corrosion of copper containing semiconductor features during chemical mechanical polishing (CMP) comprising the steps of:

providing a semiconductor wafer polishing surface including a copper layer overlying copper filled anisotropically etched features;

polishing the semiconductor wafer polishing surface according to a first CMP process including applying at least one polishing slurry to contact the semiconductor wafer polishing surface to remove a portion the copper layer to reveal a portion of an underlying barrier/adhesion layer;

polishing the semiconductor wafer polishing surface according to a second CMP process including applying a neutralizing solution including at least one carboxylic acid to contact the semiconductor wafer polishing surface;

polishing the semiconductor wafer polishing surface according to a third CMP process including applying a copper corrosion inhibitor solution to contact the semiconductor wafer polishing surface to inhibit copper corrosion; and, polishing the semiconductor wafer polishing surface according to at least a fourth CMP process to remove a remaining portion of the underlying barrier/adhesion layer.

12. The method of claim 11, wherein the first CMP process includes polishing the copper layer to endpoint detection.

13. The method of claim 11, wherein the at least one carboxylic acid is selected from the group including formic acid, acetic acid, propionic acid, valeric acid, oxalic acid, malonic acid, succinic acid, glutaric acid, maleic acid, fumaric acid, phthalic acid, glycolic acid, lactic acid, citric acid, tartaric acid, gluconic acid, and adipic acid.

14. The method of claim 11 wherein the neutralizing solution has a pH of between about 4.0 and about 6.0.

15. The method of claim 11, wherein the neutralizing solution includes Electraclean™.

16. The method of claim 11, wherein the copper corrosion inhibitor solution includes at least one of Benzotriazole (BTA) and derivatives thereof.

17. The method of claim 16, wherein the copper corrosion inhibitor solution includes a mixture of BTA and deionized water.

18. The method of claim 11, wherein the copper corrosion inhibitor solution includes Benzotriazole (BTA) present in an amount from about 0.02 to about 0.1 weight percent.

19. The method of claim 11, further comprising the step of polishing the semiconductor wafer polishing surface according to a fifth CMP process including applying a Benzotriazole (BTA) containing solution to contact the semiconductor wafer polishing surface.

20. The method of claim 17, wherein the Benzotriazole (BTA) containing solution includes BTA present in an amount from about 0.02 to about 0.1 weight percent.

* * * * *